United States Patent

Sakai

[11] Patent Number: 6,043,490
[45] Date of Patent: Mar. 28, 2000

[54] VIBRATION CANCELLATION SYSTEM FOR A CHARGED PARTICLE BEAM APPARATUS

[75] Inventor: Katsuhiko Sakai, Kawasaki, Japan

[73] Assignee: Hitachi, Ltd., Tokyo, Japan

[21] Appl. No.: 09/012,757

[22] Filed: Jan. 23, 1998

[30] Foreign Application Priority Data

Jan. 27, 1997 [JP] Japan ..................... 9-012399

[51] Int. Cl.[7] .................. G06K 9/40; H01J 37/28
[52] U.S. Cl. .......... 250/310; 250/306; 250/311; 250/440.11
[58] Field of Search .................. 250/310, 311, 250/440.11, 306

[56] References Cited

U.S. PATENT DOCUMENTS

| 4,907,287 | 3/1990 | Homma et al. ............ 382/54 |
| 4,948,971 | 8/1990 | Vogen et al. ............. 250/310 |
| 5,874,735 | 2/1999 | Matsumoto et al. ........ 250/310 |

FOREIGN PATENT DOCUMENTS

| 61-2317 | 1/1986 | Japan . |
| 64-69011 | 3/1989 | Japan . |
| 187533 U | 6/1989 | Japan . |
| 1227436 | 9/1989 | Japan . |
| 547645 | 2/1993 | Japan . |
| 6-162982 | 6/1994 | Japan . |
| 7-65760 | 3/1995 | Japan . |
| 1537478 | 12/1978 | United Kingdom . |
| WO90/05991 | 5/1990 | WIPO . |
| WO92/03840 | 3/1992 | WIPO . |

OTHER PUBLICATIONS

Patent Abstracts of Japan, vol. 9, No. 123 (E–317) & JP 60–10723 A (Fujitsu) Jan. 19, 1985.
Patent Abstracts of Japan, vol. 14, No. 65 (E–884) & JP 1–286244 A (Hitachi) Nov. 17, 1989.
Patent Abstracts of Japan, vol. 10, No. 170 (E–412) & JP 610023317 A (Nippon enshi K.K.).
Patent Abstracts of Japan, vol. 6, No. 6, (E–89) & JP 560126927 A (Fujitsu).

*Primary Examiner*—Edward P. Westin
*Assistant Examiner*—Nikita Wells
*Attorney, Agent, or Firm*—Kenyon & Kenyon

[57] ABSTRACT

Mechanical vibration detecting sensors and a sound wave sensor are provided in a column, and mechanical vibration detecting sensors, a sound wave sensor and electromagnetic wave detecting antennas are provided in a sample stage side. Outputs of the sensors and the antennas are processed by signal processing circuits and correction signals generated by these signal processing circuits are added to X-direction and Y-direction scanning signals from signal generating circuits.

7 Claims, 4 Drawing Sheets

VIBRATION CANCELLATION SYSTEM FOR A CHARGED PARTICLE BEAM APPARATUS

BACKGROUND OF THE INVENTION

The present invention relates to a charged particle beam apparatus, and more particularly to a charge particle beam apparatus in which vibration or swinging becomes a problem such as a scanning electron microscope, a charged particle beam processing apparatus and the like.

In a charged particle beam apparatus, vibration propagating from a floor is commonly intercepted or suppressed by mounting the apparatus on a vibration isolating table. As the vibration isolating table also used is an active vibration isolating table which actively varies position and height of the table in order to suppress vibration.

For coping with image troubles or processing troubles due to vibration of a sample stage, there is a method in which vibration in a the sample stage or a column is measured using a vibration pickup or the like and an operator is waiting until the vibration disappears (Japanese Patent Application Laid-Open No.64-69011), and a method in which a vibration signal of a sample stage is processed and the processed signal is added to a deflecting signal of a deflector (scanning signal) (Japanese Patent Application Laid-Open No.61-23317). In regard to methods of preventing vibration of a column or a sample stage, methods are proposed in Japanese Patent Application Laid-Open No.1-227436, Japanese Patent Application Laid-Open No.5-47645 and Japanese Utility Model Laid-Open No.1-87533.

In a scanning electron microscope and the like, as the resolution is being improved, the vibration cannot be eliminated sufficiently by a commonly used vibration isolating table. Accordingly, an active vibration isolating table is partially used. However, the active vibration isolating table cannot sufficiently remove vibration or rolling of such a very low frequency as approximately 1 Hz, which becomes an obstacle to improve the resolution in the environment where the scanning electron microscope is actually used. Further, even if vibration from the floor can be reduced by using the vibration isolating table, there are some cases where the structure on the vibration isolating table resonates with sound vibration to cause very small vibration which degrades an image of the scanning electron microscope or the like.

That is, it is revealed that rigidity of the mechanical structure of the conventional scanning electron microscope is too low to attain a required resolution. Particularly, in a case where size of the sample chamber is increased in order to observe a large sized sample such as a semiconductor wafer having a large diameter in recent years, rigidity of the sample chamber is reduced to cause rolling easily. It is clarified that this is main cause to produce an image deformation by vibration. Further, it is also clarified that electromagnetic wave existing inside the sample chamber deflects the electron beam, which may cause image trouble. However, sufficiently high rigidity of the apparatus may result in an unrealistic solution that wall thickness of the members must be increased by digits.

On the other hand, trouble due to vibration is determined by positional relationship between the column having an optical system of charged particle beam and the sample stage holding a sample, and accordingly change in relative positional relationship between the column and the sample stage, that is, a relative vibration signal cannot be obtained if vibration of only the sample stage or only the column is measured. Therefore, it is incomplete also from the theoretical view point that the trouble of vibration and rolling is removed by the common methods.

Furthermore, when the charged particle optical system is set to high resolution type, a low-magnified and wide-view-field image is likely to be deformed in its periphery. In the conventional apparatus, no measures for such a problem are taken.

SUMMARY OF THE INVENTION

An object of the present invention is to provide a charged particle beam apparatus which is suitable for reducing influence of vibration or rolling on the performance without particularly increasing rigidity of the structure.

According to one aspect of the invention, a charged particle beam apparatus is provided which comprises a charged particle beam deflector, a means for giving X-direction and Y-direction scanning signals to the charged particle beam deflector so that a sample is two-dimensionally scanned with a charged particle beam, a means for detecting an information signal characterizing the sample generated by scanning of the sample with the charged particle beam, a means for individually detecting X-direction and Y-direction components of mechanical vibration, and a means for correcting said X-direction and Y-direction scanning signals based on the detected X-direction and Y-direction component signals so as to remove an influence of the mechanical vibration.

According to another aspect of the invention, a charged particle beam apparatus is provided which comprises a charged particle beam deflector, a means for giving scanning signals to the charged particle beam deflector so that a sample is scanned with a charged particle beam, a means for detecting an information signal characterizing the sample generated by scanning of the sample with the charged particle beam, a means for detecting electromagnetic wave and/or sound wave, and a means for correcting the scanning signals based on the detected electromagnetic wave and/or sound wave signal so as to remove an influence of the electromagnetic wave and/or sound wave.

According to a still further aspect of the invention, a charged particle beam apparatus is provided which comprises an objective lens for focusing a charged particle beam onto a sample, a charged particle beam deflector, a means for giving X-direction and Y-direction scanning signals to the charged particle beam deflector so that a sample is two-dimensionally scanned with the charged particle beam, a means for detecting an information signal characterizing the sample generated by scanning of the sample with the focused charged particle beam, a means for detecting X-direction, Y-direction and Z-direction components of an electromagnetic wave, and a means for correcting the X-direction and Y-direction scanning signals and an exciting current of the objective lens based on the detected X-direction, Y-direction and Z-direction component signals respectively so as to remove an effect of the electromagnetic wave.

According to a further additional aspect of the invention, a charged particle beam apparatus is provided which comprises a means for generating a charged particle beam, a means for scanning a sample with the charged particle beam, a means for detecting an information signal characterizing the sample generated by scanning of the sample, a means for forming an image of the sample based on the detected information signal, a means for storing the formed image, a means for detecting a cause of producing deformation in the stored image, and a means for forming a deformation correcting map based on signals of the detected cause of producing deformation in the stored image and for correcting the deformation in the stored image based on the deformation correcting map.

DESCRIPTION OF THE PREFERRED EMBODIMENTS

Figure 1:
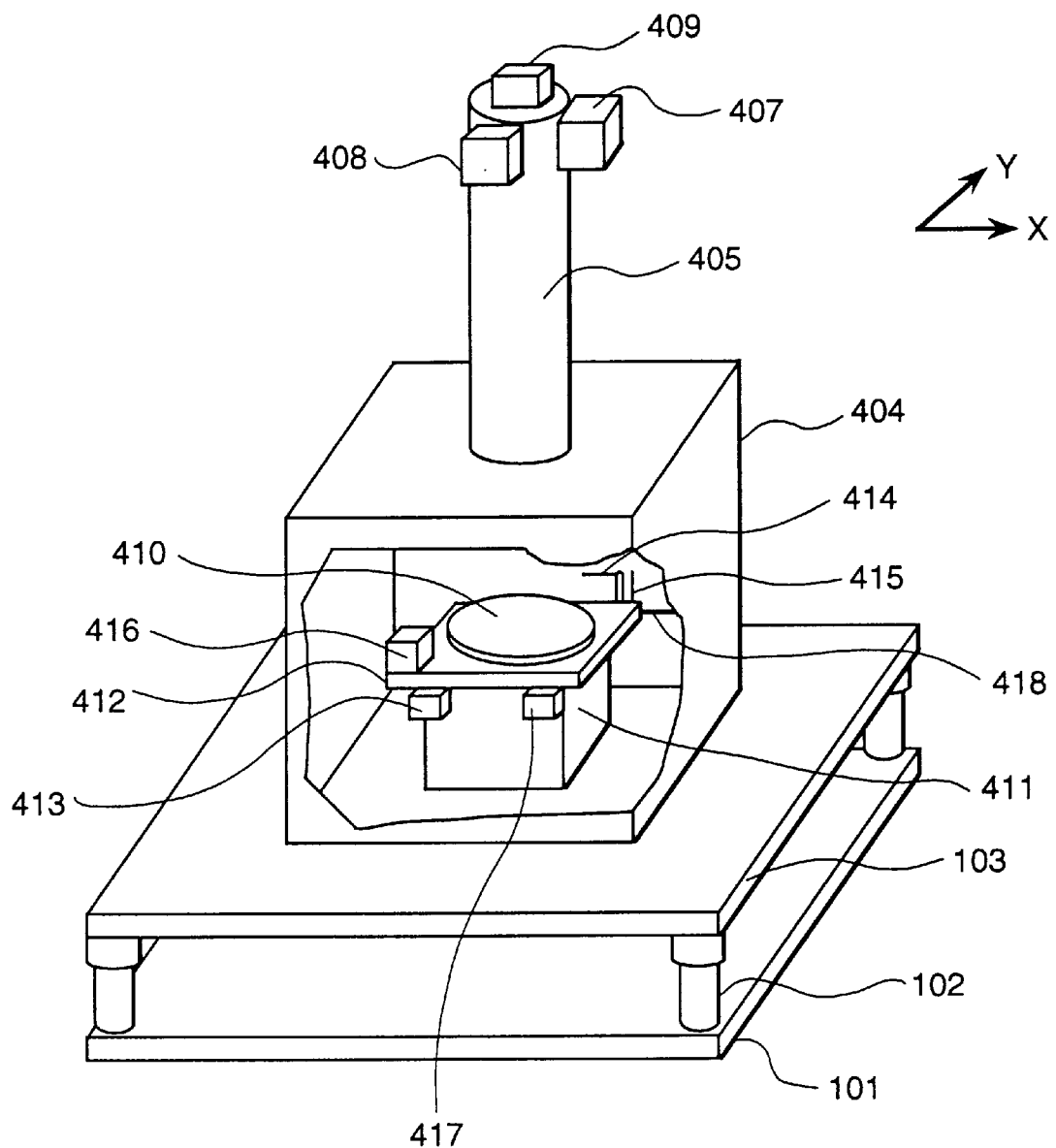
FIG. 1 is a perspective view showing an embodiment of a scanning electron microscope for observing a large sample as a charged particle beam apparatus in accordance with the present invention.

In a scanning electron microscope, a transmission electron microscope and the like, when an image is displayed on a CRT, the image information is, in most cases, once captured in an image memory. The captured image is observed and if the image has bending or jitter, that is, so-called image deformation due to vibration or rolling and distortion originally in the electron optical system, pixels are rearranged so as to eliminate the image deformation. The rearranged image does not have image deformation in appearance. When an image is displayed under the similar condition again, no apparent trouble occurs by again performing the process previously performed and displaying the processed image.

Such a process can be performed by changing deflecting (scanning) signals of an electron beam deflector of a scanning electron microscope or a electron microscope, that is, a charged particle beam deflector in general. In this case, when there is deformation in an image, a signal having reverse phase deformation to the deformation is superposed on the scanning signal of the deflector.

When deformation of an image on a memory is corrected by rearrangement, that is, performing image processing, there appear asperities in the periphery of the picture and accordingly the effective picture area may be reduced. However, in the method where a signal having reverse phase deformation to the deformation is superposed on the scanning signal of the deflector, such reduction of picture area hardly occurs.

In order to confirm image deformation, for example, bending, it is preferable to use a reference sample by which an image of a straight line can be obtained.

When deformation of an image such as jitter and bending is caused by vibration or rolling, signals of the vibration or rolling can be used for the correction of the deformation.

As disclosed, for example, in Japanese Patent Application Laid-Open No.61-23317, dislocation of irradiated position of a charged particle beam is calculated by integrating an acceleration signal twice, and pixels arrangement positions may be corrected by that amount or scanning signals may be corrected by the amount of the calculation result of dislocation. When the vibration is of a sinusoidal wave, the signal can be directly used by adjusting its phase and its intensity without integrating twice. The signal source used here is preferably a relative vibration signal of the difference between vibration of the column and vibration of the sample stage. Sensors for sensing vibrations of the column and the sample stage is respectively provided, and a mechanism for superposing these signals after processed to an output of the charged particle beam deflector and an output of the objective lens is provided.

As for the sensors, it is preferable to use microphones for picking up relatively high frequency vibration and high-sensitive piezoelectric elements for picking up very low frequency vibration. The piezoelectric elements are arranged so as to respectively measure vibrations in independent directions of X-direction and Y-direction, and the signals in respective directions are added to the deflection signals in respective directions.

A sound wave (acoustic) signal may be used as the vibration signal. However, in the case of sound wave, since the direction is not clear, sound source signals are generated so as to independently vary their intensities and phases in X-direction and in Y-direction respectively, and the intensities and phases are adjusted so as to eliminate image deformation.

In order to grasp effect of vibration with reliability, it is preferable that the scanning frequency of the electron beam deflector can be freely set and can be synchronized with a frequency of vibration. When the scanning frequency of the electron beam deflector is synchronized with the frequency of vibration, swaying due to vibration is stopped and an image is stopped while being deformed. By inputting the correction signals in that state, the deformation can be corrected and the effect of the correction can be easily grasped.

FIG. 1 shows an embodiment of a scanning electron microscope for observing a large sample as a charged particle beam apparatus in accordance with the present invention.

A load plate 103 is mounted on a base plate 101 through dampers 102, and a sample chamber 404 and a column 405 are further stacked on the load plate, and sensors 407, 408 directed in X-direction and Y-direction are provided in the upper portion of the column 405. The sensors 407, 408 are for detecting mechanical rolling or vibration in an X-scanning direction and a Y-scanning direction of an electron beam, respectively. Further, onto the upper portion of the column 405, an acoustic sensor 409 is attached. The sound wave sensor 409 is for detecting acoustic vibration propagating in the column 405.

Inside the sample chamber 404 a sample stage 411 is mounted, and a sample 410 is held on the sample stage 411 through a sample holder 412. An acoustic sensor 113 is also provided in the sample stage 411 (possibly, in the sample holder 412), and acoustic vibration propagating in the sample 410 is detected by the acoustic sensor 113.

In the sample holder 412 (possibly, in the sample stage 411) there are provided antennas 414, 415 and 418 for detecting X-direction, Y-direction and Z-direction components of an electromagnetic wave inside the sample chamber 404, and further in the sample holder 412 and the sample stage 411 (possibly, in one of them) there are provided sensors 416, 417 for detecting an X-direction component and a Y-direction component of mechanical vibration.

Figure 2:
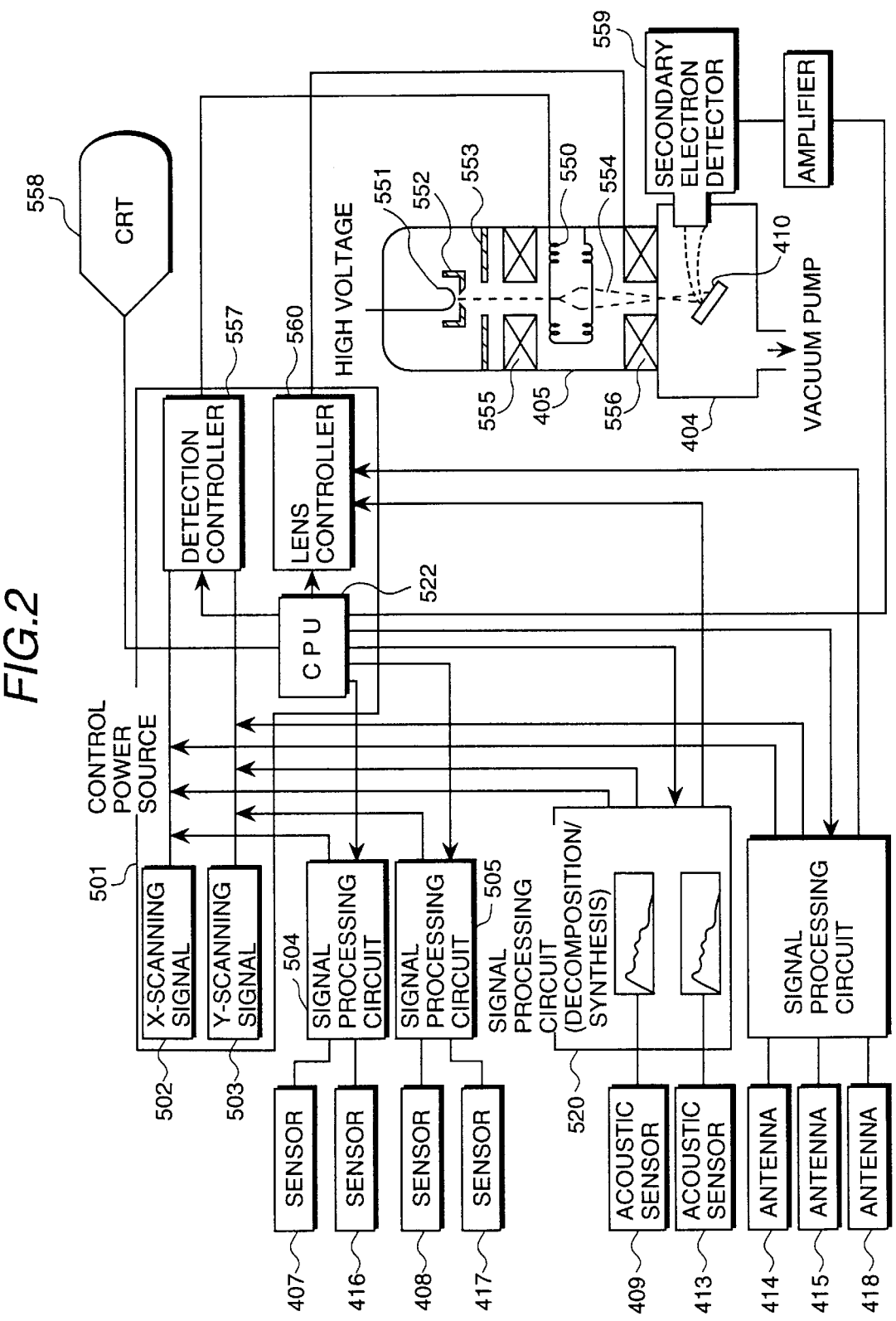
FIG. 2 is a block diagram showing the system construction of an embodiment of a scanning electron microscope for observing a large sample as a charged particle beam apparatus in accordance with the present invention.

FIG. 2 shows the system construction of an embodiment of a scanning electron microscope for observing a large sample as a charged particle beam apparatus in accordance with the present invention. Inside the column 405, an electron beam is extracted by an anode 553 from an electron gun unit composed of a filament 551 applied with a high voltage and a Wehnelt 552, and the electron beam 554 is focused on the sample 410 in side the sample chamber 404 by a condenser lens 555 and an objective lens 556. An X-direction scanning signal and a Y-direction scanning signal are supplied to an electron beam deflector 550 inside the column 405 from an X-direction scanning signal generating circuit 502 and a Y-direction scanning signal generating circuit 503 in a control supply source 501 through a deflection controller 557, and thereby the sample 410 is two-dimensionally scanned by the focused electron beam.

A secondary electron signal, which is generated from the sample 410 and is an information signal characterizing the sample, is detected by a secondary electron detector 559, and input to a CRT (image display) 558 through a CPU (central processing unit) 522. Since scanning of the sample 410 is in synchronism with scanning of the CRT, a secondary electron image of the sample 410 is displayed on the CRT 558. Of course, it is possible that the image signal detected by the detector 559 is stored in a memory in the CPU 522, and the stored image signal is displayed on the CRT 558.

Signals detected by the sensors 407, 416 are input to a signal processing circuit 504, and a correction signal of relative positional change in the X-direction between the column 405 and the sample stage 411 is generated. Similarly, signals detected by the sensors 408, 417 are input to a signal processing circuit 505, and a correction signal of relative positional change in the Y-direction between the column 405 and the sample stage 411 is generated. These correction signals are added to the X-direction scanning signal and the Y-direction scanning signal, respectively. Thereby, influence of the mechanical vibration or rolling of the image can be removed.

Signals detected by the acoustic sensors 409, 413 are input to a signal processing circuit 520. Therein, the signals are Fourier-transformed to be corrected intensity and phase in each frequency, and then synthesized. Based on the signals correction signals to be added to the X- and Y-direction scanning signals and a correction signal to be supplied to the objective lens are generated. A deflection controller 557 and an objective lens controller 560 control the electron beam deflector 550 and the objective lens 554 based on these signals, and thereby, influence of the vibration or rolling due to sound wave (acoustic wave) on the image can be removed.

Signals detected by the antennas 414, 415 and 418 are input to a signal processing circuit 521. Therein, the signals are Fourier-transformed to be corrected intensity and phase in each frequency, and then synthesized. Based on the signals correction signals to be added to the X- and Y-direction scanning signals and a correction signal to be supplied to the objective lens are generated. A deflection controller 557 and an objective lens controller 560 control the electron beam deflector 550 and the objective lens 554 based on these signals, and thereby, influence of the vibration or rolling by electromagnetic wave on the image can be removed.

Figure 3:
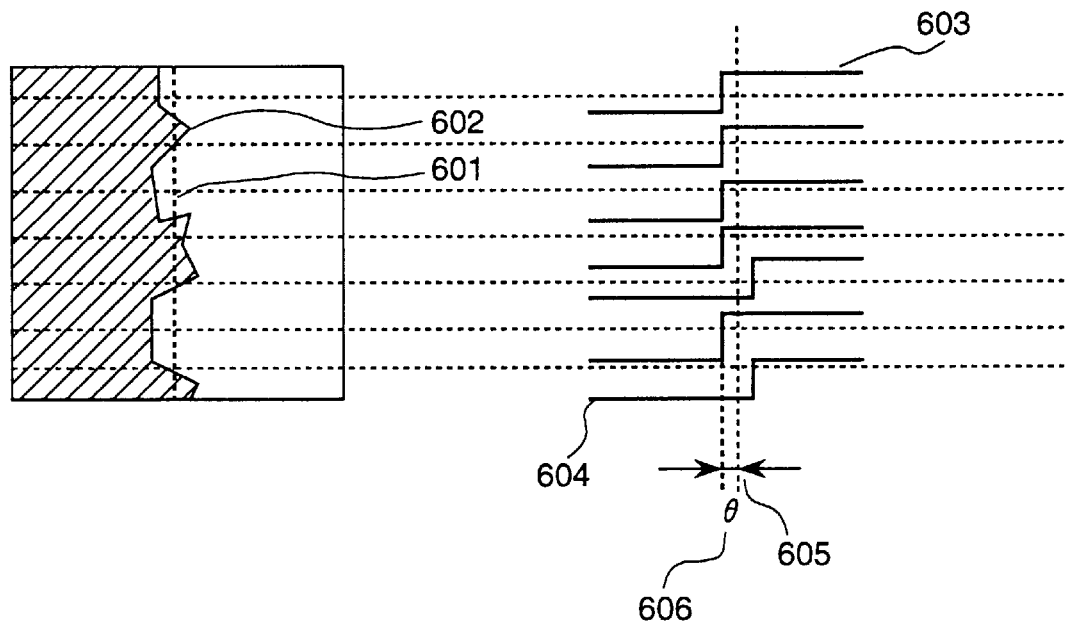
FIG. 3 is a view explaining an example of the principle of detecting image deformation for evaluating a formed image.

FIG. 3 is a view explaining an example of the principle of detecting image deformation for evaluating a formed image. The left side of FIG. 3 shows an example in which an image of a straight line is deformed in an image of a snaked line due to vibration or rolling. In the figure, the reference character 601 indicates the original straight line and the reference character 602 indicates the snaked line. According to the figure, effect of vibration appears in a phase difference θ between a rising (or falling) phase position for example, 604) of each of scanning line output signals 603 and a position 605 where it should exist. In order to lessen the phase difference θ, correction of the deformation is optimized by applying feedback from the CPU 522 to each of the signal processing circuits 504, 505, 520, 521 in FIG. 2.

Figure 4:
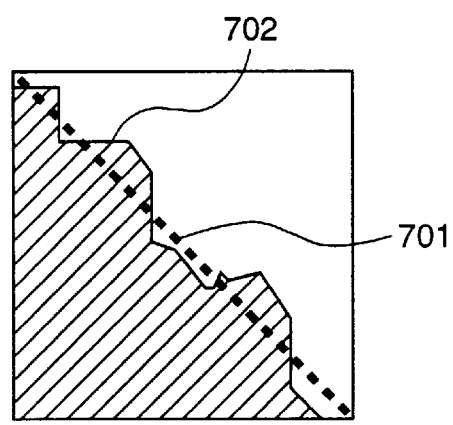
FIG. 4 is a view explaining another example of the principle of detecting image deformation for evaluating a formed image.

FIG. 4 is a similar view to the left side of the FIG. 3, and the figure is an example in which the straight line 701 and the snaked line 702 are inclined. In this case, correction of the image deformation for vibration in X-direction and Y-direction is optimized based on the same detection principle as in FIG. 3.

It is preferable that adjusting of optimization of vibration correction is performed using an adjusting pattern for giving an image of a straight line, that is, a reference (standard) pattern.

Further, in order to accurately grasp vibration in X- and Y-directions, the adjusting pattern preferably gives straight lines in more number of directions than two directions of X- and Y-directions. Otherwise, if the stage is rotatable, vibration in an arbitrary angle can be detected by combining variation of a sample direction by rotating the stage and variation (rotation: raster rotation) of deflection of an electron optical system.

Figure 5:
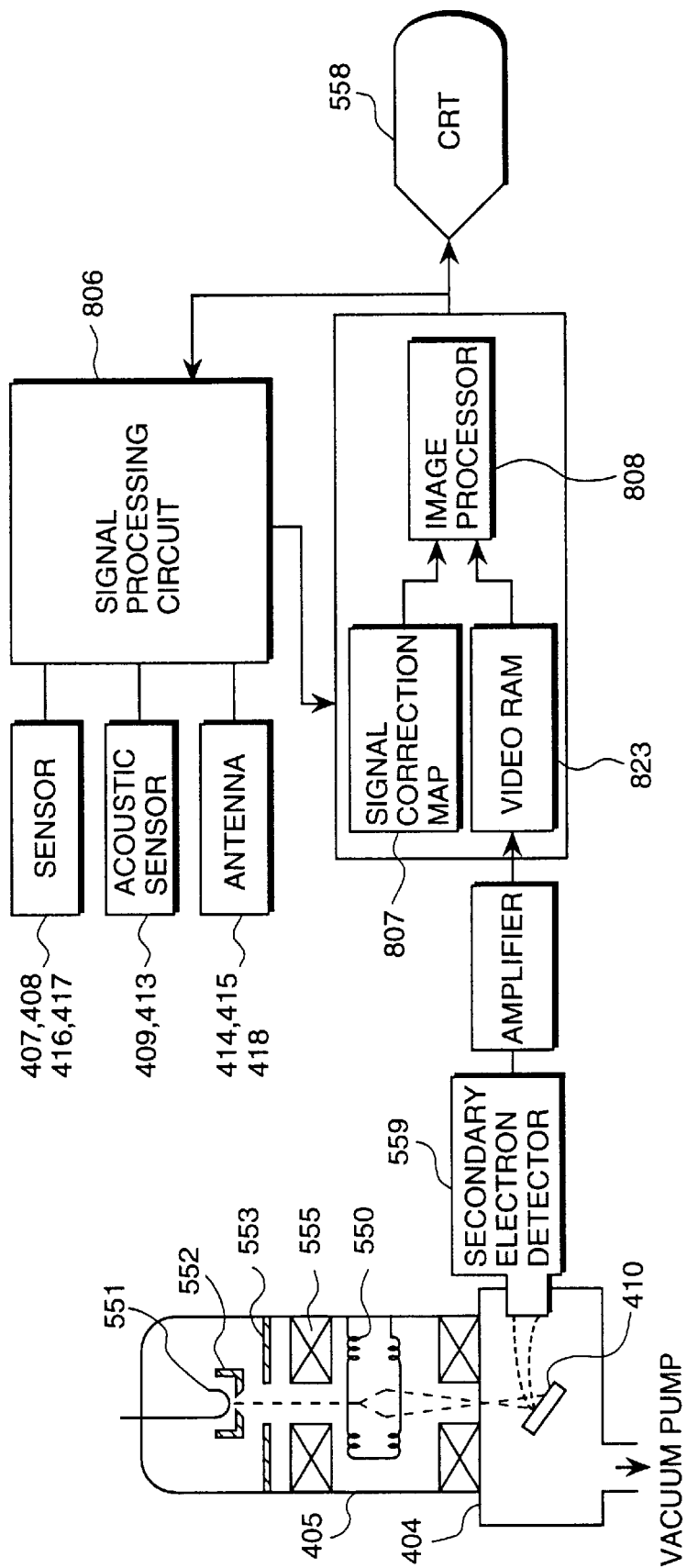
FIG. 5 is a block diagram showing the system construction of another embodiment of a scanning electron microscope for observing a large sample as a charged particle beam apparatus in accordance with the present invention.

FIG. 5 shows the system construction of another embodiment of a scanning electron microscope for observing a large sample as a charged particle beam apparatus in accordance with the present invention. This is an example in which effect of vibration is removed using an image processing technology. Detected secondary electron signals are once captured and stored in a video RAM 823 of memory as a picture. On the other hand, a signal processing circuit 806 decomposes and synthesizes output signals of each of sensors and antennas (407 to 409, 413 to 418: these are the same as those of FIG. 2) captured in the signal processing circuit 806, and then forms a correction map 807 for the image stored in the video RAM 823 based on phase information. The image of the video RAM 823 is corrected based on the correction map by an image processor 808, and then displayed on a CRT 558.

Image deformation observed under the same condition can be corrected by using the same correction map. Therefore, by storing a correction map under a specified observation condition, when an image is observed under the same condition, correction of the image can be easily performed by read out the stored correction map. Further, by storing a plurality of correction maps obtained under a plurality of conditions, correction of images can be easily performed under more various conditions. That is, it is convenient that the correcting map is formed and stored for each of observing conditions, and by selecting one of the observing conditions a correcting map corresponding the selected observing condition is read out, and the image being corrected based on the read-out correcting map.

When an image which should be essentially a straight line is displayed a snaked line, the snaked line may be corrected to a straight line by the same method as described in connection with the embodiment of FIG. 2. In this case, the image obtained in FIG. 5 is corrected by signal processing operation of the CPU in the signal processor 806 in the same method as described in connection with the embodiment of FIG. 2 regardless of external rolling or vibration.

These methods are also effective for correction of deformation caused by the electron optical system such as spool-shaped deformation, barrel-shaped deformation and spiral deformation, not shown, appears in an image.

The embodiments described above are examples of scanning electron microscopes to which the present invention is applied. In addition to the scanning electron microscope, the present invention is also very effective to apply to an observation and analysis apparatus such as a transmission electron microscope, a focused ion beam apparatus or the like, and to a pattening apparatus such as an electron beam patterning apparatus or the like.

According to the present invention, it is possible to provide a charged particle beam apparatus which is suitable for reduce influence of vibration or rolling on the performance without particularly increasing rigidity of the structure.

What is claimed is:

1. A charged particle beam apparatus comprising:
   a charged particle beam deflector, means for giving scanning signals to said charged particle beam deflector so that a sample is scanned with a charged particle beam,
   means for detecting an information signal characterizing said sample generated by scanning of said sample with said charged particle beam, means for detecting an electromagnetic wave and/or sound wave, and means for correcting said scanning signals based on said detected electromagnetic wave and/or sound wave signal so as to remove an effect of said electromagnetic wave and/or sound wave.

2. A charged particle beam apparatus comprising:

an objective lens for focusing a charged particle beam onto a sample, a charged particle beam deflector, means for giving X-direction and Y-direction scanning signals to said charged particle beam deflector so that a sample is two-dimensionally scanned with said charged particle beam, means for detecting an information signal characterizing said sample generated by scanning of said sample with said focused charged particle beam, means for detecting X-direction, Y-direction and Z-direction components of an electromagnetic wave, and means for correcting said X-direction, Y-direction and Z-direction component scanning signals respectively so as to remove an influence of said electromagnetic wave.

3. A charged particle beam apparatus according to claim 1, which further comprises a column including said charged particle beam deflector and a sample chamber including said sample stage for holding said sample, and said sound wave detecting means includes sensors provided in said column and sensors provided in said sample stage so as to detect relative vibration between said column and said sample stage.

4. A charged particle beam apparatus comprising:

means for generating a charged particle beam, means for scanning a sample with said charged particle beam, means for detecting an information signal characterizing said sample generated by scanning of said sample, means for forming an image of said sample based on said detected information signal, means for storing said formed image, means for detecting a cause of producing deformation in said stored image including an electromagnetic wave and/or sound wave detecting means, and means for forming a deformation correcting map based on signals of said detected cause of producing deformation in said stored image and for correcting the deformation in said stored image based on said deformation correcting map.

5. A charged particle beam apparatus comprising:

means for generating a charged particle beam, means for scanning a sample with said charred particle beam, means for detecting an information signal characterizing said sample generated by scanning of said sample, means for forming an image of said sample based on said detected information signal, means for storing said formed image, means for detecting a cause of producing deformation in said stored image, including an electromagnetic wave detecting means which detects X-direction, Y-direction and Z-direction components of an electromagnetic wave as said image deformation producing cause, and means for forming a deformation correcting map based on signals of said detected cause of producing deformation in said stored image and for correcting the deformation in said stored image based on said deformation correcting map.

6. A charged particle beam apparatus comprising:

a column including a charged particle generating source, a sample chamber including a sample stage for holding said sample, means for generating a charged particle beam, means for scanning a sample with said charred particle beam, means for detecting an information signal characterizing said sample generated by scanning of said sample, means for forming an image of said sample based on said detected information signal, means for storing said formed image, means for detecting a cause of producing deformation in said stored image, including a sound wave detecting means including sound wave sensors provided in said column and sound wave sensors provided in said sample stage so as to detect relative vibration between said column and said sample stage, and means for forming a deformation correcting map based on signals of said detected cause of producing deformation in said stored image and for correcting the deformation in said stored image based on said deformation correcting map.

7. A charged particle beam apparatus comprising:

an objective lens focusing a charged particle beam onto a sample, a charged particle beam deflector, means for applying X-direction and Y-direction scanning signals to said charged particle beam deflector so that said sample is two-dimensionally scanned with said charged particle beam, means for detecting an information signal characterizing said sample generated by the scanning of said sample with said focused charged particle beam, means for detecting an electromagnetic wave, and means for correcting an exciting current of said objective lens on the basis of a Z-direction component of said detected electromagnetic wave so as to remove an influence thereof.

* * * * *